United States Patent
Heeney et al.

(10) Patent No.: US 7,541,425 B2
(45) Date of Patent: Jun. 2, 2009

(54) MONO-, OLIGO- AND POLY(3-ALKYNYLTHIOPHENES) AND THEIR USE AS CHARGE TRANSPORT MATERIALS

(75) Inventors: Martin Heeney, Southampton (GB); Steven Tierney, Southampton (GB); Clare Bailey, Hamshire (GB); Iain McCulloch, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 843 days.

(21) Appl. No.: 10/661,812

(22) Filed: Sep. 15, 2003

(65) Prior Publication Data

US 2004/0127592 A1  Jul. 1, 2004

(30) Foreign Application Priority Data

Sep. 14, 2002  (EP)  .................. 02020711

(51) Int. Cl.
- *C08G 75/00* (2006.01)
- *H01L 29/02* (2006.01)
- *H01L 29/08* (2006.01)
- *H01L 29/10* (2006.01)

(52) U.S. Cl. ................. 528/377; 528/373; 522/6; 252/299.01; 257/40

(58) Field of Classification Search ........... 528/373, 528/377; 252/299.01; 522/6; 257/40
See application file for complete search history.

(56) References Cited

OTHER PUBLICATIONS

Hayashi et al, Preparation and properties of polythiophene with phenylacetylene substituent, 2001, Kobunshi Ronbunshu, 58(5), 221-226 (JP), Chem Abstrcat 135: 153178.*

Salzner et al, Theoretical analysis of substituent effects on building blocks of conducting polymers; 3,4'-substitued bithiophenes, Journal of orgainc chemictry, 64(3), 764-769, 1999, Chem Abstract 130: 197214.*

* cited by examiner

*Primary Examiner*—Duc Truong
(74) *Attorney, Agent, or Firm*—Millen, White, Zelano, Branigan, P.C.

(57) ABSTRACT

The invention relates to new conjugated mono-, oligo- and poly(3-alkynylthiophenes). The invention further relates to methods for their preparation, their use as semiconductors or charge transport materials in optical, electrooptical or electronic devices including field effect transistors, electroluminescent, photovoltaic and sensor devices. The invention further relates to field effect transistors and semiconducting components comprising the new mono-, oligo- and polymers.

27 Claims, No Drawings

MONO-, OLIGO- AND POLY(3-ALKYNYLTHIOPHENES) AND THEIR USE AS CHARGE TRANSPORT MATERIALS

FIELD OF INVENTION

The invention relates to new conjugated mono-, oligo- and poly(3-alkynylthiophenes). The invention further relates to methods for their preparation, their use as semiconductors or charge transport materials in optical, electrooptical or electronic devices including field effect transistors, electroluminescent, photovoltaic and sensor devices. The invention further relates to field effect transistors and semiconducting components comprising the new mono-, oligo- and polymers.

BACKGROUND OF THE INVENTION

Organic materials have recently shown promise as the active layer in organic based thin film transistors and organic field effect transistors [see H. E. Katz et al., *Acc. Chem. Res.*, 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1 \times 10^{-3}$ cm$^2$ V$^{-1}$ S$^{-1}$). In addition, it is important that the semiconducting material is relatively stable to oxidation, i.e., it has a high ionization potential, as oxidation leads to reduced device performance.

A known compound which has been shown to be an effective p-type semiconductor for OFETs is pentacene [see S. F. Nelson et al., *Appl. Phys. Lett.*, 1998, 72, 1854]. When deposited as a thin film by vacuum deposition, it was shown to have carrier mobilities in excess of 1 cm$^2$ V$^{-1}$ s$^{-1}$ with very high current on/off ratios greater than 10$^6$. However, vacuum deposition is an expensive processing technique that is unsuitable for the fabrication of large-area films.

Regioregular head-to-tail poly(3-hexylthiophene) has been reported with charge carrier mobility between $1 \times 10^{-5}$ and $4.5 \times 10^{-2}$ cm$^2$ V$^{-1}$ s$^{-1}$, but with a rather low current on/off ratio between 10 and 10$^3$ [see Z. Bao et al., *Appl. Pys. Lett.*, 1996, 69, 4108]. This low on/off current is due in part to the low ionization potential of the polymer, which can lead to oxygen doping of the polymer under ambient conditions, and a subsequent high off current [see H. Sirringhaus et al., *Adv. Solid State Phys.*, 1999, 39, 101]. A high regioregularity leads to improved packing and optimized microstructure, leading to improved charge carrier mobility [see H. Sirringhaus et al., *Science*, 1998, 280, 1741-1744; H. Sirringhaus et al., *Nature*, 1999, 401, 685-688; and H. Sirringhaus, et al., *Synthetic Metals*, 2000, 111-112, 129-132]. In general, poly(3-alkylthiophenes) show improved solubility and are able to be solution processed to fabricate large area films. However, poly(3-alkylthiophenes) have relatively low ionization potentials and are susceptible to doping in air.

Grell et al., *J. Korean Phys. Soc.*, 2000, 36(6), 331 suggest a reactive mesogen comprising a conjugated distyrylbenzene core with two reactive acrylate end groups as a model compound for molecular electronics. However, there is no disclosure of reactive mesogens of 3-alkynylthiophene.

SUMMARY OF THE INVENTION

It is an aim of the present invention to provide new materials for use as semiconductors or charge transport materials, which are easy to synthesize, have high charge mobility, good processibility and oxidative stability. Other aims of the invention are immediately evident to those skilled in the art from the following description.

The inventors have found that these aims can be achieved by providing novel polymers based on 3-alkynylthiophene (1). In particular, novel regioregular head-to-tail poly(3-alkynylthiophenes) according to the present invention are advantageous as they show strong interchain π-π-stacking interactions and a high degree of crystallinity, making them effective charge transport materials with high carrier mobilities. In addition, the introduction of an alkynyl functionality in the 3-position leads to an increase in the ionization potential of the polymer, compared e.g. to poly(3-alkylthiophene) (PAT) which is known on prior art, due to the electron withdrawing nature of the triple bond. Triple bonds have positive Hammett constants (both $\sigma^-_{para}$ and $\sigma_{meta}$) which are indicative of both an inductive and resonant withdrawing effect [E. J. A. Dean, *Lange's Handbook of Chemistry*, 12th Edition, 1979, 3-134]. When used in a semiconductor device, this reduces oxygen doping of the semiconductor and improves the on/off ratio of the device.

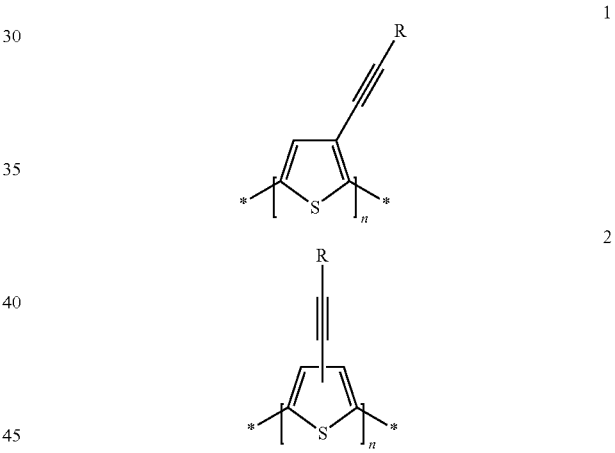

Furthermore, alkyl substituents (R) can be incorporated to solubilize the novel polymers (1) and to promote crystallinity and so make them readily solution processable. Solution processing has the advantage over vacuum deposition processing of being a potentially cheaper and faster technique. Furthermore, the synthetic route affords material of high regioregularity, which has been shown to improve packing density and optimize microstructure, leading to high carrier mobility (see above).

A further aspect of the invention relates to the synthesis of novel, regiorandom poly(3-alkynyl)thiophenes (2) which are amorphous in character and have improved electroluminescent properties compared to the more ordered regioregular polymer, especially when carrying a bulky substituent R, like for example adamantyl, cyclohexyl or pyrenyl.

A further aspect of the invention relates to reactive mesogens having a central core comprising one or more 3-alkynylthiophene units, and optionally containing further unsaturated organic groups that form a conjugated system together with the 3-alkynylthiophene units, said core being linked, optionally via a spacer group, to one or two polymerizable groups. The reactive mesogens can induce or enhance liquid crystal phases or are liquid crystalline themselves. They can be oriented in their mesophase and the polymerizable group(s) can be polymerised or crosslinked in situ to form polymer films with a high degree of order, thus yielding improved semiconductor materials with high stability and high charge carrier mobility.

A further aspect of the invention relates to liquid crystal polymers, in particular liquid crystal side chain polymers obtained from the reactive mesogens according to the present invention, which are then further processed, e.g., from solution as thin layers for use in semiconductor devices.

Definition of Terms

The terms 'liquid crystalline or mesogenic material' or 'liquid crystalline or mesogenic compound' means materials or compounds comprising one or more rod-shaped, lath-shaped or disk-shaped mesogenic groups, i.e., groups with the ability to induce liquid crystal phase behavior. The compounds or materials comprising mesogenic groups do not necessarily have to exhibit a liquid crystal phase themselves. It is also possible that they show liquid crystal phase behavior only in mixtures with other compounds, or when the mesogenic compounds or materials, or the mixtures thereof, are polymerised.

The term 'polymerizable' includes compounds or groups that are capable of participating in a polymerisation reaction, like radicalic or ionic chain polymerisation, polyaddition or polycondensation, and reactive compounds or reactive groups that are capable of being grafted for example by condensation or addition to a polymer backbone in a polymer-analoguous reaction.

The term 'film' includes self-supporting, i.e., free-standing, films that show more or less pronounced mechanical stability and flexibility, as well as coatings or layers on a supporting substrate or between two substrates.

DETAILED DESCRIPTION OF THE INVENTION

The invention relates to mono-, oligo- and polymers of formula I

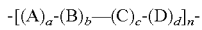

in particular to mono-, oligo- and polymers of formula I1

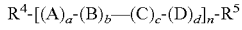

wherein

A and C denote independently of each other a group of formula II

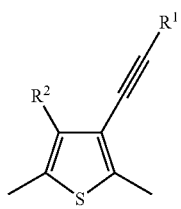

$R^1$ is in each occurrence independently of one another H, halogen, straight chain, branched or cyclic alkyl with 1 to 20 C-atoms, which is unsubstituted, mono- or poly-substituted by F, Cl, Br, I or CN, wherein one or more non-adjacent $CH_2$ groups are optionally replaced, in each case independently from one another, by —O—, —S—, —NH—, —NR$^o$—, —SiR$^o$R$^{oo}$—, —CO—, —COO—, —OCO—, —OCO—O—, —SO$_2$—, —S—CO—, —CO—S—, —CH=CH— or —C≡C— in such a manner that O and/or S atoms are not linked directly to one another, or denotes optionally substituted aryl or heteroaryl or P-Sp-, $R^2$ has one of the meanings of $R^1$ or denotes —C≡C—$R^3$, $R^3$ has one of the meanings of $R^1$, $R^4$ and $R^5$ have independently of each other one of the meanings of $R^1$, or denote an alkoxylated boron group of the formula B(OR')(OR") or an SnR$^o$R$^{oo}$R$^{ooo}$ group, $R^{o-ooo}$ are independently of each other H or alkyl with 1 to 12 C-atoms, R' and R" are independently of each other H or alkyl with 1 to 12 C-atoms, or OR' and OR" together with the boron atom form a cyclic group having 2 to 10 C atoms, P is a polymerizable or reactive group, Sp is a spacer group or a single bond, B and D are independently of each other —CX$^1$=CX$^2$—, —C≡C—, or optionally substituted arylene or heteroarylene, $X^1$ and $X^2$ are independently of each other H, F, Cl or CN, a, b, c, d are independently of each other 0 or 1, with a+b+c+d>0, and wherein in at least one recurring unit [(A)$_a$-(B)$_b$—(C)$_c$-(D)$_d$] at least one of a and c is 1, and n is an integer ≧1, wherein the recurring units [(A)$_a$-(B)$_b$—(C)$_c$-(D)$_d$] can be identical or different.

The invention further relates to the use of mono-, oligo- and polymers according to the invention as semiconductors or charge transport materials, in particular in optical, electrooptical or electronic devices, like for example components of integrated circuitry, field effect transistors (FET) for example as thin film transistors in flat panel display applications or for Radio Frequency Identification (RFID) tags, or in semiconducting components for organic light emitting diode (OLED) applications such as electroluminescent displays or backlights of, e.g., liquid crystal displays, for photovoltaic or sensor devices, as electrode materials in batteries, as photoconductors and for electrophotographic applications like electrophotographic recording.

The invention further relates to a field effect transistor, for example as a component of integrated circuitry, as a thin film transistor in flat panel display applications, or in a Radio Frequency Identification (RFID) tag, comprising one or more mono-, oligo- or polymers according to the invention.

The invention further relates to a semiconducting component, for example in OLED applications like electroluminescent displays or backlights of, e.g., liquid crystal displays, in photovoltaic or sensor devices, as electrode materials in batteries, as photoconductors and for electrophotographic applications, comprising one or more mono-, oligo- or polymers according to the invention.

The invention further relates to a security marking or device comprising an RFID or ID tag or a FET according to the invention.

The mono-, oligo- and polymers according to the present invention are especially useful as charge transport semiconductors in that they have high carrier mobilities. Particularly preferred are mono-, oligo- and polymers wherein $R^1$ and/or $R^2$ in the groups A and C denote alkyl or fluoroalkyl groups. The introduction of alkyl and fluoroalkyl side chains to the groups A and C improves the solubility and therefore the solution processibility of the inventive materials. Furthermore, the presence of fluoroalkyl side chains also renders the inventive materials effective as n-type semiconductors.

In particular, regioregular head-to-tail poly(3-alkynylthiophenes) according to the present invention are advantageous as they show strong interchain π-π-stacking interactions and a high degree of crystallinity, making them effective charge transport materials with high carrier mobilities. The presence of the alkynyl functionality in the 3-position leads to an increase in the ionization potential of the polymer, and, when used in a semiconductor device, reduces oxygen doping of the semiconductor and improves the on/off ratio of the device.

Particularly preferred are mono-, oligo- and polymers comprising at least one group of formula II and at least one reactive group that is capable of a polymerisation or crosslinking reaction.

Further preferred are mono-, oligo- and polymers comprising at least one group of formula II that are mesogenic or liquid crystalline, in particular polymers of formula I or I1 forming calamitic phases, and reactive mesogens of formula I or I1, comprising one or more groups P-Sp-X, forming calamitic phases.

In the oligo- and polymers of the present invention the recurring units $[(A)_a\text{-}(B)_b\text{—}(C)_c\text{-}(D)_d]$ in case of multiple occurrence can be selected of formula I independently of each other, so that an oligo- or polymer may comprise identical or different recurring units $[(A)_a\text{-}(B)_b\text{—}(C)_c\text{-}(D)_d]$. The oligo- and polymers thus include homopolymers and copolymers like for example

- statistically random copolymers, for example with a monomer sequence such as -A-B—C—C—B-D-A-B-D- or -A-C-A-A-C—,
- alternating copolymers, for example with a monomer sequence such as -A-B—C-D-A-B—C-D- or -A-B—C-A-B—C—, and
- block copolymers, for example with a monomer sequence such as -A-A-B—B—B—B—C—C—C-D-D-D-, wherein the groups A, B, C and D preferably together form a conjugated system.

Further preferred are mono-, oligo- and polymers comprising one or more recurring units $[(A)_a\text{-}(B)_b\text{—}(C)_c\text{-}(D)_d]$, wherein a=1 and b=c=d=0, very preferably consisting exclusively of such recurring units.

Further preferred are mono-, oligo- and polymers comprising one or more recurring units $[(A)_a\text{-}(B)_b\text{—}(C)_c\text{-}(D)_d]$, wherein b=c=d=1 and a=0, very preferably consisting exclusively of such recurring units.

Further preferred are mono-, oligo- and polymers comprising one or more recurring units $[(A)_a\text{-}(B)_b\text{—}(C)_c\text{-}(D)_d]$, wherein a=b=c=1 and d=0, very preferably consisting exclusively of such recurring units.

Further preferred are mono-, oligo- and polymers comprising one or more recurring units $[(A)_a\text{-}(B)_b\text{—}(C)_c\text{—}D)_d]$, wherein a=b=1 and c=d=0, very preferably consisting exclusively of such recurring units.

Further preferred are mono-, oligo- and polymers of formula I and I1 wherein n is an integer from 1 to 5000,
n is an integer from 2 to 5000, in particular from 20 to 1000,
n is an integer from 2 to 5,
n is 2 and one or both of $R^4$ and $R^5$ denote P-Sp-,
n is an integer from 1 to 15 and one or both of $R^4$ and $R^5$ denote P-Sp-,
n is an integer from 2 to 5000 and $R^4$ and $R^5$ are not P-Sp-, the molecular weight is from 5000 to 100000, $R^2$ is H,
$R^2$ is —C≡C—$R^3$ and $R^1$ and $R^3$ are identical,
$R^1$, $R^2$ and/or $R^3$ are selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, or optionally substituted aryl or heteroaryl, in particular $C_1$-$C_{20}$-alkyl or $C_1$-$C_{20}$-fluoroalkyl,
$R^4$ and $R^5$ are selected from $C_1$-$C_{20}$-alkyl that is optionally substituted with one or more fluorine atoms, $C_1$-$C_{20}$-alkenyl, $C_1$-$C_{20}$-alkynyl, $C_1$-$C_{20}$-alkoxy, $C_1$-$C_{20}$-thioalkyl, $C_1$-$C_{20}$-silyl, $C_1$-$C_{20}$-ester, $C_1$-$C_{20}$-amino, $C_1$-$C_{20}$-fluoroalkyl, and optionally substituted aryl or heteroaryl,
B and D are optionally substituted arylene or heteroarylene,
B and D are —$CX^1$=$CX^2$— or —C≡C—,
in at least one recurring unit $[(A)_a\text{-}(B)_b\text{—}(C)_c\text{-}(D)_d]$, a=b=c=1 and d=0, and B is arylene or heteroarylene or —$CX^1$=$CX^2$— or —C≡C—,
n>1.

Especially preferred are mono-, oligo- and polymers having units selected from the following formulae

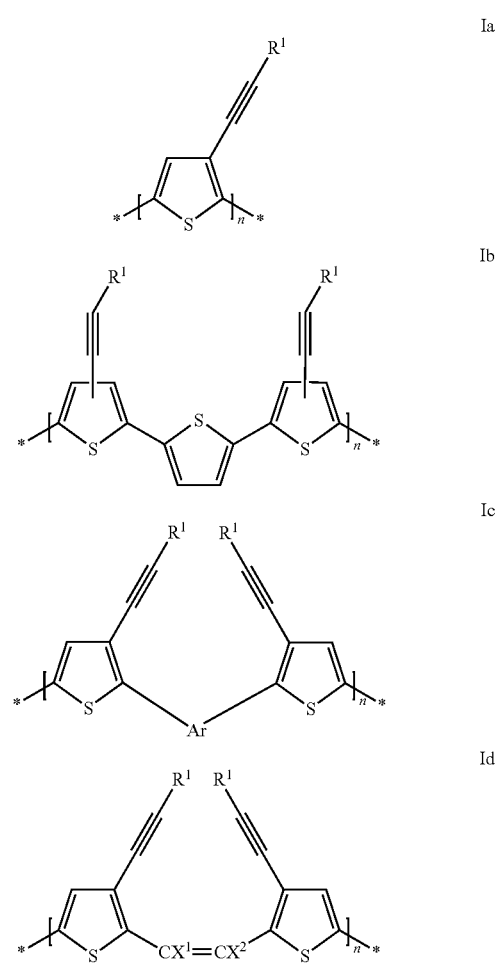

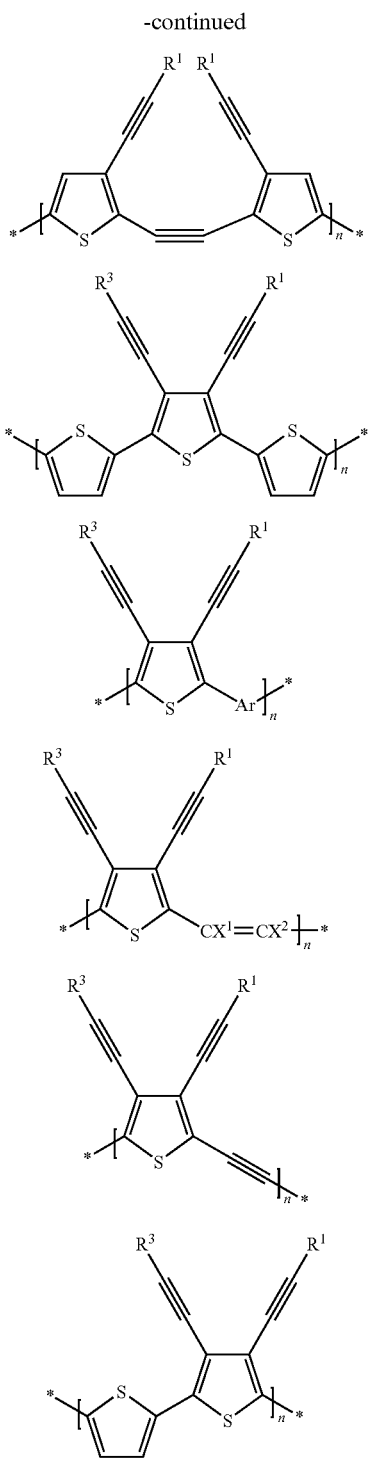

wherein R¹, R³, X¹ and X² have the meanings given above, Ar is arylene or heteroarylene which in each case is optionally substituted by one or more groups R¹ as defined in formula I, and n is an integer from 1 to 5000.

Especially preferred are regioregular polymers of formula I or I1, in particular regioregular homopolymers containing recurring units of formula II or of the preferred formulae shown above, very preferably regioregular head-to-tail poly (3-alkynylthiophenes) of formula Ia. The regioregularity in these polymers is preferably at least 90%, in particular 95% or more, very preferably 98% or more, most preferably from 99 to 100%.

Particularly preferred are oligo- and polymers of formula I or I1 comprising recurring units selected from the above preferred formulae Ia to Ii, wherein n is an integer from 2 to 5000, in particular from 20 to 1000, R¹ is alkyl with 1-16 C-atoms that is optionally fluorinated, Ar is 1,4-phenylene, alkoxyphenylene, alkylfluorene, thiophene-2,5-diyl, thienothiophene-2,5-diyl or dithienothiophene-2,6-diyl, X¹ and X² are H, CN or F, and wherein R⁴ and R⁵ are independently of each other H, halogen, alkyl with 1-16 C atoms that is optionally fluorinated, or P-Sp-.

Further preferred are reactive monomers of formula I or I1 comprising recurring units selected from the above preferred formulae Ia to Ii, wherein n is 2, R¹ is alkyl with 1-16 C-atoms that is optionally fluorinated, Ar is 1,4-phenylene, alkoxyphenylene, alkylfluorene, thiophene-2,5-diyl, thienothiophene-2,5-diyl or dithienothiophene-2,6-diyl, X¹ and X² are H, CN or F, and wherein one of R⁴ and R⁵ is H, halogen, alkyl with 1-16 C atoms that is optionally fluorinated, or P-Sp-, and the other is P-Sp-.

Aryl and heteroaryl preferably denote a mono-, bi- or tricyclic aromatic or heteroaromatic with up to 25 C atoms, wherein the rings can be fused, and in which the heteroaromatic groups contain at least one hetero ring atom, preferably selected from N, O and S. The aryl and heteroaryl groups are optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent CH₂ groups are optionally replaced, in each case independently from one another, by —O—, —S—, —NH—, —NR⁰—, —SiR⁰R⁰⁰—, —CO—, —COO—, OCO—, —OCO—O, —S—CO—, —CO—S—, —CH=CH— or —C≡C— in such a manner that O and/or S atoms are not linked directly to one another.

Especially preferred aryl and heteroaryl groups are phenyl in which, in addition, one or more CH groups may be replaced by N, naphthalene, thiophene, thienothiophene, dithienothiophene, alkyl fluorene and oxazole, all of which are unsubstituted, mono- or polysubstituted with L, wherein L is halogen or an alkyl, alkoxy, alkylcarbonyl or alkoxycarbonyl group with 1 to 12 C atoms, wherein one or more H atoms are optionally replaced by F or Cl.

Arylene and heteroarylene preferably denote a mono-, bi- or tricyclic divalent aromatic or heteroaromatic radicals with up to 25 C atoms, wherein the rings can be fused, and in which the heteroaromatic groups contain at least one hetero ring atom, preferably selected from N, O and S. The arylene and heteroarylene groups are optionally substituted with one or more of F, Cl, Br, I, CN, and straight chain, branched or cyclic alkyl having 1 to 20 C atoms, which is unsubstituted, mono- or poly-substituted by F, Cl, Br, I, —CN or —OH, and in which one or more non-adjacent CH₂ groups are optionally replaced, in each case independently from one another, by —O—, —S—, —NH—, —NR⁰—, —SiR⁰R⁰⁰—, —CO—, —COO—, OCO—, —OCO—O, —S—CO—, —CO—S—, —CH=CH— or —C≡C— in such a manner that O and/or S atoms are not linked directly to one another.

Especially preferred arylene and heteroarylene groups are 1,4-phenylene in which, in addition, one or more CH groups are optionally replaced by N, naphthalene-2,6-diyl, thiophene-2,5-diyl, thienothiophene-2,5-diyl, dithienothiophene-2,6-diyl, alkyl fluorene and oxazole, all of which are unsubstituted, mono- or polysubstituted with L as defined above.

$CX^1=CX^2$ is preferably —CH=CH—, —CH=CF—, —CF=CH—, —CF=CF—, —CH=C(CN)— or —C(CN)=CH—.

If in the formulae shown above and below one of $R^1$ to $R^5$ is an alkyl or alkoxy radical, i.e., where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Oxaalkyl, i.e., where one $CH_2$ group is replaced by —O—, is preferably straight-chain 2-oxapropyl (=methoxymethyl), 2- (=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-or 7-oxaoctyl, 2-, 3-, 4-, 5-, 6-, 7- or 8-oxanonyl or 2-, 3-, 4-, 5-, 6-, 7-, 8- or 9-oxadecyl, for example.

Fluoroalkyl is preferably $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$.

Halogen is preferably F, Br or Cl.

Hetero atoms are preferably selected from N, O and S.

The polymerizable or reactive group P is preferably selected from $CH_2=CW^1$—COO—,

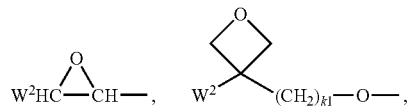

$CH_2=CW^2$—(O)$_{k1}$—, $CH_3$—CH=CH—O—, $(CH_2=CH)_2$CH—OCO—, $(CH_2=CH$—$CH_2)_2$CH—OCO—, $(CH_2=CH)_2$CH—O—, $(CH_2=CH$—$CH_2)_2$N—, HO—$CW^2W^3$—, HS—$CW^2W^3$—, $HW^2$N—, HO—$CW^2W^3$—NH—, $CH_2=CW^1$—CO—NH—, $CH_2=CH$—(COO)$_{k1}$-Phe-(O)$_{k2}$—, Phe-CH=CH—, HOOC—, OCN—, and $W^4W^5W^6$Si—, with $W^1$ being H, Cl, CN, phenyl or alkyl with 1 to 5 C-atoms, in particular H, Cl or $CH_3$, $W^2$ and $W^3$ being independently of each other H or alkyl with 1 to 5 C-atoms, in particular methyl, ethyl or n-propyl, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1.

Especially preferred groups P are $CH_2=CH$—COO—, $CH_2=C(CH_3)$—COO—, $CH_2=CH$—, $CH_2=CH$—O—, $(CH_2=CH)_2CH$—OCO—, $(CH_2=CH)_2CH$—O—, and

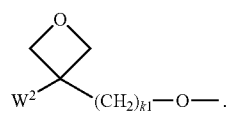

Very preferred are acrylate and oxetane groups. Oxetanes produce less shrinkage upon polymerisation (cross-linking), which results in less stress development within films, leading to higher retention of ordering and fewer defects. Oxetane cross-linking also requires cationic initiator, which unlike free radical initiator is inert to oxygen.

As for the spacer group Sp all groups can be used that are known for this purpose to the skilled in the art. The spacer group Sp is preferably of formula Sp'-X, such that P-Sp- is P-Sp'-X—, wherein Sp' is alkylene with up to 20 C atoms which may be unsubstituted, mono- or poly-substituted by F, Cl, Br, I or CN, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, X is —O—, —S—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C—, —CH=CH—COO—, —OCO—CH=CH— or a single bond, and $R^0$, $R^{00}$, $X^1$ and $X^2$ have one of the meanings given above.

X is preferably —O—, —S—, —$OCH_2$—, —$CH_2O$—, —$SCH_2$—, —$CH_2S$—, —$CF_2O$—, —$OCF_2$—, —$CF_2S$—, —$SCF_2$—, —$CH_2CH_2$—, —$CF_2CH_2$—, —$CH_2CF_2$—, —$CF_2CF_2$—, —CH=N—, —N=CH—, —N=N—, —CH=$CR^0$—, —$CX^1=CX^2$—, —C≡C— or a single bond, in particular —O—, —S—, —C≡C—, —$CX^1=CX^2$— or a single bond, very preferably a group that is able to from a conjugated system, such as —C≡C— or —$CX^1=CX^2$—, or a single bond.

Typical groups Sp' are, for example, —$(CH_2)_p$—, —$(CH_2CH_2O)_q$—$CH_2CH_2$—, —$CH_2CH_2$—S—$CH_2CH_2$— or —$CH_2CH_2$—NH—$CH_2CH_2$— or —$(SiR^0R^{00}$—O)$_p$—, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Further preferred are compounds with one or two groups P-Sp- wherein Sp is a single bond.

In case of compounds with two groups P-Sp-, each of the two polymerizable groups P and the two spacer groups Sp can be identical or different.

SCLCPs obtained from the inventive compounds or mixtures by polymerisation or copolymerisation have a backbone that is formed by the polymerizable group P in formula I.

The mono-, oligo- and polymers of the present invention can be synthesized according to or in analogy to known methods. Some preferred methods are described below. Therein, R has one of the meanings of $R^1$ in formula I.

The entire disclosure[s] of all applications, patents and publications, cited herein and of corresponding European application No. 02020711.4, filed Sep. 14, 2003 is incorporated by reference herein.

EXAMPLES

Synthesis of Regioregular Head-to-tail poly(3-alkylnylthiophene) (1): Route 1

Starting from commercially available 3-iodothiophene (3), a route to poly(3-alkynylthiophene) (1) is outlined in scheme 1 below. 3-Iodothiophene (3) is brominated in the 2,5-positions with N-bromosuccinimide NBS to afford to 2,5-dibromo-3-iodothiophene [see S. Gronowitz et al., *Acta Chemica Scandinavica B*, 1976, 30, 423-429]. Subsequent reaction with a terminal alkyne under Sonogashira conditions affords 2,5-dibromo-3-alkynylthiophene (4). Poly(3-alkynylthiophene) (1) is synthesized from (4) by the route described by McCullough [see R. S. Loewe et al., *Macromolecules*, 2000, p. A-J, and R. D. McCullough, U.S. Pat. No. 6,166,172]. Treatment with one equivalent of an alkyl or vinyl Grignard reaction results in a Grignard metathesis to form the aryl Grignard reagent. Addition of a catalytic amount of Ni(dppp)Cl$_2$ affords regioregular head-to-tail poly(3-alkynylthiophene) (1). Polymerisation can also be performed by the route described by Rieke [see T.-A- Chen and R. D. Rieke, *J. Am. Chem. Soc.*, 1992, 114, 10087]. Treatment of with highly active zinc dust affords the organozinc intermediate, which is polymerised by reaction with catalytic Ni(dppp)Cl$_2$. Polymerisation of (4) can also be performed by Stille or Suzuki methodology [see S. Guillerez and G. Bidan, *Synthetic Metals*, 1998, 93, 123; and A. Iraqi and G. W. Barker, *Journal of Materials Chemistry*, 1998. 8(1), 25-29].

Scheme 1:

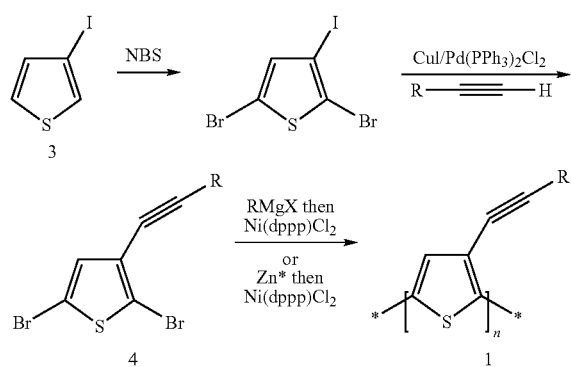

Synthesis of Regioregular Head-to-tail poly(3-alkynylthiophene) (1): Route 2

An alternative route to key intermediate 2,5-dibromo-3-alkynylthiophene (4) is outlined in scheme 2. Readily available 3-bromothiophene is cross-coupled with an alkynylzinc reagent in the presence of a palladium catalyst to afford 3-alkynylthiophene (5). The alkynyzinc reagent is formed by treatment of a terminal alkyne with butyllithium to afford the alkynyllithium in situ, subsequent treatment with zinc chloride forms the organozinc reagent. Alternatively cross-coupling of 3-bromothiophene with a terminal alkyne in the presence of copper and palladium catalysts under Sonogashira conditions affords (5). The 3-alkynylthiophene can be dilithiated with 2 equivalents of butyl lithium and the di-lithio intermediate quenched with iodine or a bromine source (NBS or carbon tetrabromide) to afford the 2,5-diiodo-3-alkynylthiophene or 2,5-dibromo-3-alkynylthiophene (4) respectively. Polymerisation can occur via the methods described above.

Scheme 2:

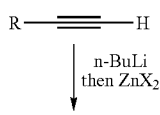

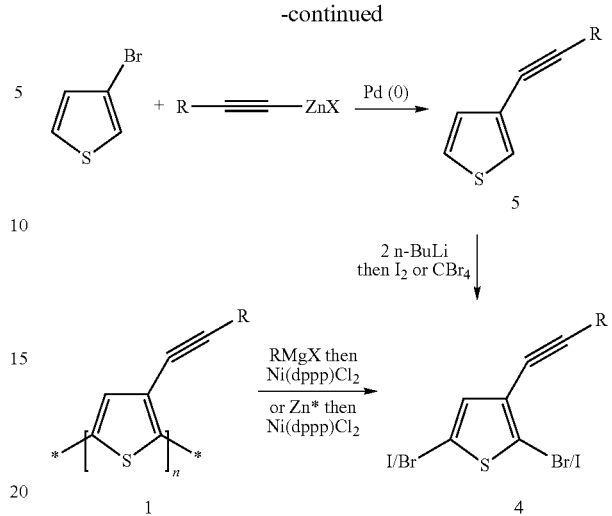

Synthesis of Regioregular Head-to-tail poly(3-alkylnylthiophene) (1): Route 3

Starting from commercially available 3-iodothiophene (3), a route to poly(3-alkynylthiophene) (1) is outlined in scheme 3 below. 3-Iodothiophene (3) is brominated selectively in the 2-position with N-bromosuccinimide NBS to afford to 2-bromo-3-iodothiophene. [see S. Gronowitz et al., *Acta Chemica Scandinavica B*, 1976, 30, 423-429]. Subsequent reaction with a terminal alkyne under Sonogashira conditions affords 2-bromo-3-alkynylthiophene (6). Poly(3-alkynylthiophene) (1) is synthesized from (6) by the route described by McCullough [see R. D. McCullough et al., *J. Org. Chem.*, 1993, 58, 904]. Treatment with one equivalent of lithium diisopropylamide (LDA) results in selective lithiation of (6). The lithio species is treated with MgBr$_2$.Et$_2$O to form the aryl Grignard reagent. Addition of a catalytic amount of Ni(dppp)Cl$_2$ affords regioregular head-to-tail poly(3-alkynylthiophene) (1). A modified version of this method can also be performed whereby ZnCl$_2$ is used instead of MgBr$_2$.Et$_2$O to form the aryl zinc reagent.

Scheme 3:

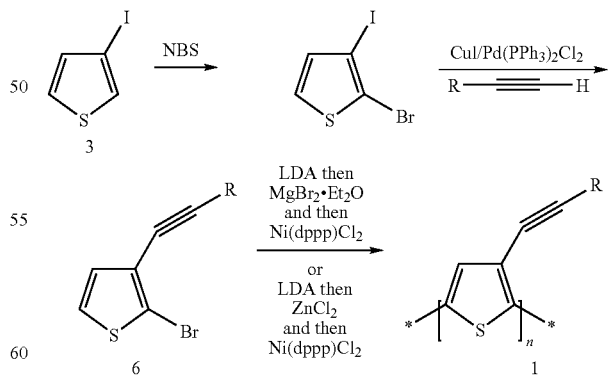

Synthesis of Regiorandom poly(3-alkylnylthiophene):

Regiorandom poly(alkynyl)thiophene (2) is readily synthesized by the treatment of 3-alkynylthiophene (5) with a solution of ferric chloride as shown in scheme 4.

Scheme 4:

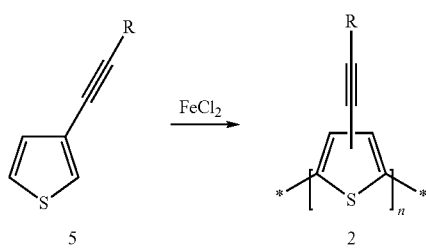

Reactive Mesogens

Compounds of formula I or I1 comprising polymerizable groups P can be synthesized according or in analogy to the following methods.

According to scheme 5, 2-bromo-3-alkynylthiophene (4) is cross-coupled with an alkyl Grignard reagent in the presence of a nickel catalyst to yield protected mono-alkyl alcohol (7). Subsequent bromination occurs in the 5 position. A cross-coupling reaction with an aryl bisorganotin or bisboronic ester affords bis-alcohol (8). Routine methodology converts the bis-alcohol (8) into the bis-acrylate or bis-oxetane.

Scheme 5:

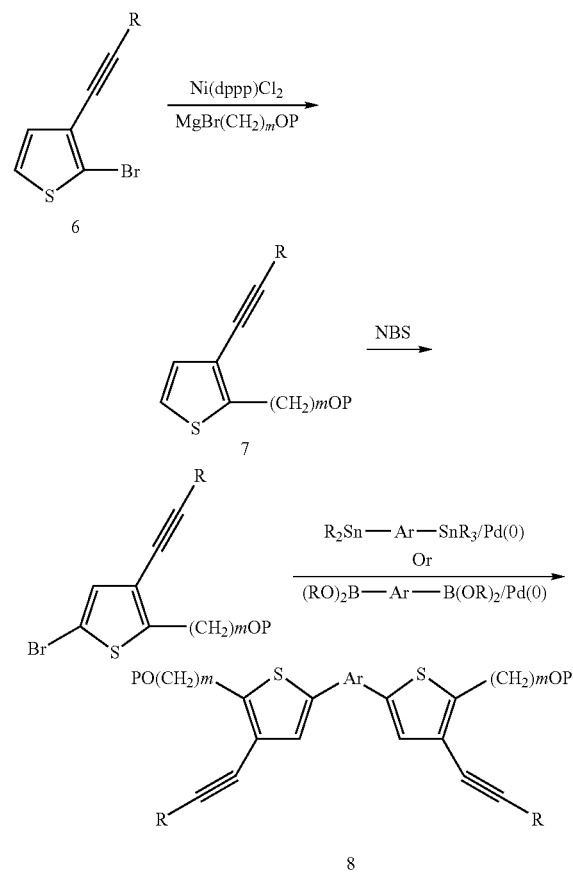

Polymerisation of reactive mesogens can be carried out for example by thermal cross-linking or photoinitiated cross-linking.

Polymers Containing Conjugated Groups C≡C, CX1=CX2 or Ar

The Stille coupling of 2,5-dibromo-3-(alkynyl)thiophene (4) with the bis-organotin reagent (9) yields polymer (10) containing $CX^1=CX^2$ groups. Coupling of 4 with an aryl bis(organotin) reagent or with an aryl bisboronic ester affords polymers containing an aryl group (11) (scheme 6).

Scheme 6:

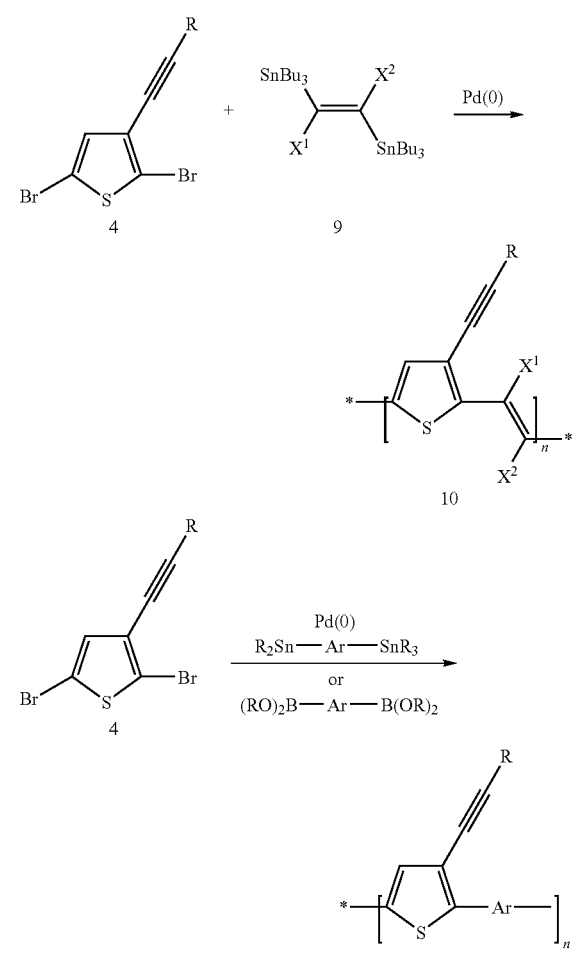

The reaction of 2-bromo-3-alkynylthiophene (6) with a bis organotin reagent affords dithiophene (12). This is readily polymerised by treatment with ferric chloride to afford regio-regular polymer (13) (scheme 7)

Scheme 7:

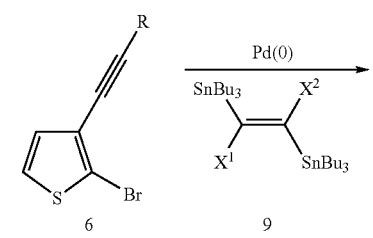

-continued

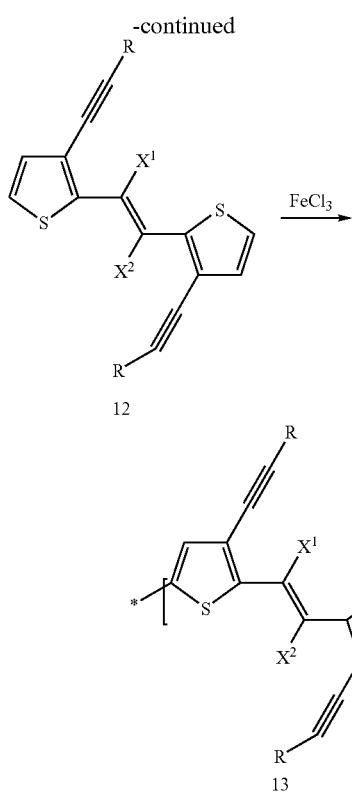

A further aspect of the invention relates to both the oxidised and reduced form of the compounds and materials according to this invention. Either loss or gain of electrons results in formation of a highly delocalized ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalised ionic centers in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^{2-}$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, La$(NO_3)_3 \cdot 6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds and materials of the present invention can be used as an organic "metal" in applications, for example, but not limited to, charge injection layers and ITO planarizing layers in organic light emitting diode applications, films for flat panel displays and touch screens, antistatic films, printed conductive substrates, patterns or tracts in electronic applications such as printed circuit boards and condensers.

A preferred embodiment of the present invention relates to mono-, oligo- and polymers of formula I or I1 that are mesogenic or liquid crystalline, and very preferably comprise one or more polymerizable groups. Very preferred materials of this type are monomers and oligomers of formula I1 wherein n is an integer from 1 to 15 and $R^4$ and/or $R^5$ denote P-Sp-.

These materials are particularly useful as semiconductors or charge transport materials, as they can be aligned into uniform highly ordered orientation in their liquid crystal phase by known techniques, thus exhibiting a higher degree of order that leads to particularly high charge carrier mobility. The highly ordered liquid crystal state can be fixed by in situ polymerisation or crosslinking via the groups P to yield polymer films with high charge carrier mobility and high thermal, mechanical and chemical stability.

For example, if a device is made from a polymerizable liquid crystal material by polymerisation in situ, the liquid crystal material preferably comprises one or more mono- or oligomers of formula I1 and its preferred subformulae wherein one or both of $R^4$ and $R^5$ denote P-Sp-. If a liquid crystal polymer is prepared first, for example by polymerisation in solution, and the isolated polymer is used to make the device, the polymer is preferably made from a liquid crystal material comprising one or more mono- or oligomers of formula I1 and its preferred subformulae wherein one of $R^4$ and $R^5$ denotes P-Sp-.

It is also possible to copolymerize the polymerizable mono-, oligo- and polymers according to the present invention with other polymerizable mesogenic or liquid crystal monomers that are known from prior art, in order to induce or enhance liquid crystal phase behavior.

Thus, another aspect of the invention relates to a polymerizable liquid crystal material comprising one or more mono-, oligo- or polymers of the present invention as described above and below comprising at least one polymerizable group, and optionally comprising one or more further polymerizable compounds, wherein at least one of the polymerizable mono-, oligo- and polymers of the present invention and/or the further polymerizable compounds is mesogenic or liquid crystalline.

Particularly preferred are liquid crystal materials having a nematic and/or smectic phase. For FET applications smectic materials are especially preferred. For OLED applications nematic or smectic materials are especially preferred.

Another aspect of the present invention relates to an anisotropic polymer film with charge transport properties obtainable from a polymerizable liquid crystal material as defined above that is aligned in its liquid crystal phase into macroscopically uniform orientation and polymerised or crosslinked to fix the oriented state.

Polymerisation is preferably carried out by in-situ polymerisation of a coated layer of the material, preferably during fabrication of the electronic or optical device comprising the inventive semiconductor material. In case of liquid crystal materials, these are preferably aligned in their liquid crystal state into homeotropic orientation prior to polymerisation, where the conjugated pi-electron systems are orthogonal to the direction of charge transport. This ensures that the intermolecular distances are minimized and hence the energy required to transport charge between molecules is minimized. The molecules are then polymerised or crosslinked to fix the uniform orientation of the liquid crystal state. Alignment and curing are carried out in the liquid crystal phase or mesophase of the material. This technique is known in the art and is generally described for example in D. J. Broer, et al., Angew. Makromol. Chem. 183, (1990), 45-66

Alignment of the liquid crystal material can be achieved for example by treatment of the substrate onto which the material is coated, by shearing the material during or after coating, by application of a magnetic or electric field to the coated material, or by the addition of surface-active compounds to the liquid crystal material. Reviews of alignment techniques are given for example by I. Sage in "Thermotropic Liquid Crystals," edited by G. W. Gray, John Wiley & Sons, 1987, pages 75-77, and by T. Uchida and H. Seki in "Liquid Crystals—Applications and Uses Vol. 3," edited by B. Bahadur, World Scientific Publishing, Singapore 1992, pages 1-63. A review of alignment materials and techniques is given by J. Cognard, Mol. Cryst. Liq. Cryst. 78, Supplement 1 (1981), pages 1-77.

Polymerisation takes place by exposure to heat or actinic radiation. Actinic radiation means irradiation with light, like UV light, IR light or visible light, irradiation with X-rays or gamma rays or irradiation with high energy particles, such as ions or electrons. Preferably polymerisation is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like e.g. a UV laser, an IR laser or a visible laser.

Polymerisation is preferably carried out in the presence of an initiator absorbing at the wavelength of the actinic radiation. For example, when polymerizing by means of UV light, a photoinitiator can be used that decomposes under UV irradiation to produce free radicals or ions that start the polymerisation reaction. When curing polymerizable materials with acrylate or methacrylate groups, preferably a radical photoinitiator is used, when curing polymerizable materials with vinyl, epoxide and oxetane groups, preferably a cationic photoinitiator is used. It is also possible to use a polymerisation initiator that decomposes when heated to produce free radicals or ions that start the polymerisation. As a photoinitiator for radical polymerisation for example the commercially available Irgacure 651, Irgacure 184, Darocure 1173 or Darocure 4205 (all from Ciba Geigy AG) can be used, whereas in case of cationic photopolymerization the commercially available UVI 6974 (Union Carbide) can be used.

The polymerizable material can additionally comprise one or more other suitable components such as, for example, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colorants, dyes or pigments.

Mono-, oligo- and polymers comprising one or more groups P-Sp- can also be copolymerised with polymerizable mesogenic compounds to induce, or, in case of mesogenic materials of formula I or I1, enhance liquid crystal phase behavior. Polymerizable mesogenic compounds that are suitable as comonomers are known in prior art and disclosed for example in WO 93/22397; EP 0,261,712; DE 195,04,224; WO 95/22586 and WO 97/00600.

Another aspect of the invention relates to a liquid crystal side chain polymer (SCLCP) obtained from a polymerizable liquid crystal material as defined above by polymerisation or polymeranaloguous reaction. Particularly preferred are SCLCPs obtained from one or more monomers according to formula I1 wherein one or both of $R^4$ and $R^5$ are a polymerizable or reactive group, or from a polymerizable mixture comprising one or more of such monomers of formula I1.

Another aspect of the invention relates to an SCLCP obtained from one or more monomers of formula I1 wherein one or both of $R^4$ and $R^5$ are a polymerizable group, or from a polymerizable liquid crystal mixture as defined above, by copolymerisation or polymeranaloguous reaction together with one or more additional mesogenic or non-mesogenic comonomers.

Side chain liquid crystal polymers or copolymers (SCLCPs), in which the semiconducting component is located as a pendant group, separated from a flexible backbone by an aliphatic spacer group, offer the possibility to obtain a highly ordered lamellar like morphology. This structure consists of closely packed conjugated aromatic mesogens, in which very close (typically <4 Å) pi-pi stacking can occur. This stacking allows intermolecular charge transport to occur more easily, leading to high charge carrier mobilities. SCLCPs are advantageous for specific applications as they can be readily synthesized before processing and then e.g. be processed from solution in an organic solvent. If SCLCPs are used in solutions, they can orient spontaneously when coated onto an appropriate surface and when at their mesophase temperature, which can result in large area, highly ordered domains.

SCLCPs can be prepared from the polymerizable compounds or mixtures according to the invention by the methods described above, or by conventional polymerisation techniques which are known to those skilled in the art, including for example radicalic, anionic or cationic chain polymerisation, polyaddition or polycondensation. Polymerisation can be carried out for example as polymerisation in solution, without the need of coating and prior alignment, or polymerisation in situ. It is also possible to form SCLCPs by grafting compounds according to the invention with a suitable reactive group, or mixtures thereof, to presynthesized isotropic or anisotropic polymer backbones in a polymeranaloguous reaction. For example, compounds with a terminal hydroxy group can be attached to polymer backbones with lateral carboxylic acid or ester groups, compounds with terminal isocyanate groups can be added to backbones with free hydroxy groups, compounds with terminal vinyl or vinyloxy groups can be added, e.g., to polysiloxane backbones with Si—H groups. It is also possible to form SCLCPs by copolymerisation or polymeranaloguous reaction from the inventive compounds together with conventional mesogenic or non mesogenic comonomers. Suitable comonomers are known to those skilled in the art. In principle it is possible to use all conventional comonomers known in the art that carry a reactive or polymerizable group capable of undergoing the desired polymer-forming reaction, like for example a polymerizable or reactive group P as defined above. Typical mesogenic comonomers are for example those mentioned in WO 93/22397, EP 0 261 712, DE 195 04 224, WO 95/22586, WO 97/00600 and GB 2 351 734. Typical non mesogenic comonomers are for example alkyl mono- or diacrylates or alkyl mono- or dimethacrylates with alkyl groups of 1 to 20 C atoms, like methyl acrylate or methyl methacrylate, trimethylpropane trimethacrylate or pentaerythritol tetraacrylate.

The mono-, oligo- and polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

Especially the oligomers and polymers according to the invention show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated derivatives.

The materials of the present invention are useful as optical, electronic and semiconductor materials, in particular as charge transport materials in field effect transistors (FETs), as photovoltaics or sensor materials, for electrophotographic recording, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the mono-, oligo- and polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the inventive compounds, materials or films, especially those which show photoluminescent properties, may be employed as materials of light sources, e.g., of display devices such as described in EP 0 889 350 A1 or by C. Weder et al., Science, 279, 1998, 835-837.

The preceding examples can be repeated with similar success by substituting the generally or specifically described reactants and/or operating conditions of this invention for those used in the preceding examples.

From the foregoing description, one skilled in the art can easily ascertain the essential characteristics of this invention and, without departing from the spirit and scope therof, can make various changes and modifications of the invention to adapt it to various usages and conditions.

What is claimed is:

1. A monomer, oligomer or polymer of formula I $$-[(A)_a-(B)_b-(C)_c-(D)_d]_n- \qquad I$$

wherein

A and C denote independently of each other a group of formula II

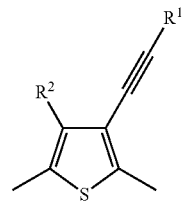

II $R^1$ is, in each occurrence independently of one another, halogen, or straight chain, branched or cyclic alkyl with 1 to 20 C-atoms, which is unsubstituted, mono- or poly-substituted by F, Cl, Br, I or CN, wherein one or more non-adjacent $CH_2$ groups are optionally replaced, in each case independently from one another, by —O—, —S—, —NH—, —NR$^0$—, —CO—, —COO—, —OCO—, —OCO—O—, —SO$_2$—, —S—CO—, —CO—S—, —CH=CH— or —C≡C— in such a manner that O and/or S atoms are not linked directly to one another, or $R^1$ is optionally substituted heteroaryl or P—Sp—, $R^2$ is H or —C≡C—$R^3$, or is halogen, or straight chain, branched or cyclic alkyl with 1 to 20 C-atoms, which is unsubstituted, mono- or poly-substituted by F, Cl, Br, I or CN, wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CH=CH— or —C≡C— in such a manner that O and/or S atoms are not linked directly to one another, or is optionally substituted aryl or heteroaryl or P—Sp—, $R^3$ is H, halogen, or straight chain, branched or cyclic alkyl with 1 to 20 C-atoms, which is unsubstituted, mono- or poly-substituted by F, Cl, Br, I or CN, wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CH=CH— or —C≡C— in such a manner that O and/or S atoms are not linked directly to one another, or is optionally substituted aryl or heteroaryl or P—Sp—, $R^0$ and $R^{00}$ are independently of each other H or alkyl with 1 to 12 C-atoms, P is a polymerizable or reactive group, Sp is a spacer group or a single bond, B and D are independently of each other $-CX^1=CX^2-$, $-C\equiv C-$, or optionally substituted arylene or heteroarylene, $X^1$ and $X^2$ are independently of each other H, F, Cl or CN, a, b, c, d are independently of each other 0 or 1, with a +b+c+d>0, and wherein in at least one recurring unit $[(A)_a\text{-}(B)_b-(C)_c\text{-}(D)_d]$ at least one of a and c is 1, and n is an integer $\geqq 1$, and wherein the recurring units $[(A)_a\text{-}(B)_b-(C)_c-(D)_d]$ are identical or different.

2. A monomer, oligomer or polymer according to claim 1, which is of formula I1

$$R^4\text{-}[(A)_a\text{-}(B)_b-(C)_c\text{-}(D)_d]_n\text{-}R^5 \quad\quad\quad I1$$

wherein A, B, C, D, a, b, c, d and n are as defined in formula I, $R^4$ and $R^5$, independently of each other, are H, B(OR')(OR") or $SnR^0R^{00}R^{000}$, or halogen, or straight chain, branched or cyclic alkyl with 1 to 20 C-atoms, which is unsubstituted, mono- or poly-substituted by F, Cl, Br, I or CN, wherein one or more non-adjacent $CH_2$ groups are optionally replaced, in each case independently from one another, by $-O-$, $-S-$, $-NH-$, $-NR^0-$, $-SiR^0R^{00}-$, $-CO-$, $-COO-$, $-OCO-$, $-OCO-O-$, $-SO_2-$, $-S-CO-$, $-CO-S-$, $-CH=CH-$ or $-C\equiv C-$ in such a manner that O and/or S atoms are not linked directly to one another, or are optionally substituted aryl or heteroaryl or P-Sp-, $R^{0-000}$ are independently of each other H or alkyl with 1 to 12 C-atoms, and R' and R" are independently of each other H or alkyl with 1 to 12 C-atoms, or OR' and OR" together with the boron atom form a cyclic group having 2 to 10 C atoms.

3. A monomer, oligomer or polymer according to claim 1, wherein n is an integer from 1 to 5000.

4. A monomer, oligomer or polymer according to claim 2, wherein n is an integer from 1 to 5000.

5. A monomer, oligomer or polymer according to claim 1, wherein $R^1$, $R^2$ and/or $R^3$ are selected from $C_1\text{-}C_{20}$-alkyl that is optionally substituted with one or more fluorine atoms, $C_1\text{-}C_{20}$-alkenyl, $C_1\text{-}C_{20}$-alkynyl, $C_1\text{-}C_{20}$-alkoxy, $C_1\text{-}C_{20}$-thioether, $C_1\text{-}C_{20}$-silyl, $C_1\text{-}C_{20}$-ester, $C_1\text{-}C_{20}$-amino, $C_1\text{-}C_{20}$-fluoroalkyl, or optionally substituted aryl or heteroaryl.

6. A monomer, oligomer or polymer according to claim 2, wherein $R^1$, $R^2$ and/or $R^3$ are selected from $C_1\text{-}C^{20}$-alkyl that is optionally substituted with one or more fluorine atoms, $C_1\text{-}C_{20}$-alkenyl, $C_1\text{-}C_{20}$-alkynyl, $C_1\text{-}C_{20}$-alkoxy, $C_1\text{-}C_{20}$-thioether, $C_1\text{-}C_{20}$-silyl, $C_1\text{-}C_{20}$-ester, $C_1\text{-}C_{20}$-amino, $C_1\text{-}C_{20}$-fluoroalkyl, or optionally substituted aryl or heteroaryl.

7. A monomer, oligomer or polymer according to claim 5, wherein $R^2$ is $-C\equiv C-R^3$ and $R^1$ and $R^3$ are identical groups as defined in formula I.

8. A monomer, oligomer or polymer according to claim 6, wherein $R^2$ is $-C\equiv C-R^3$ and $R^1$ and $R^3$ are identical groups as defined in formula I.

9. A monomer, oligomer or polymer according to claim 2, wherein n is an integer from 1 to 15 and one or both of $R^4$ and $R^5$ denote P-Sp-.

10. An oligomer or polymer according to claim 1, wherein n is an integer from 2 to 5000.

11. An oligomer or polymer according to claim 2, wherein n is an integer from 2 to 5000.

12. A monomer, oligomer or polymer according to claim 1, having at least one P-Sp- group wherein P is selected from $CH_2=CW^1-COO-$,

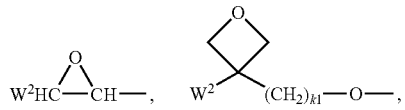

$CH_2=CW^2-(O)_{k1}-$, $CH_3-CH=CH-O-$, $(CH_2=CH)_2CH-OCO-$, $(CH_2=CH-CH_2)_2CH-OCO-$, $(CH_2=CH)_2CH-O-$, $(CH_2=CH-CH_2)_2N-$, $HO-CW^2W^3-$, $HS-CW^2W^3-$, $HW^2N-$, $HO-CW^2W^3-NH-$, $CH_2=CW^1-CO-NH-$, $CH_2=CH-(COO)_{k1}-Phe-(O)_{k2}-$, $Phe-CH=CH-$, $HOOC-$, $OCN-$, and $W^4W^5W^6Si-$, with $W^1$ being H, Cl, CN, phenyl or alkyl with 1 to 5 C-atoms, $W^2$ and $W^3$ being independently of each other H or alkyl with 1 to 5 C-atoms, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1.

13. A monomer, oligomer or polymer according to claim 2, having at least one P-Sp- group wherein P is selected from $CH_2=CW^1-COO-$,

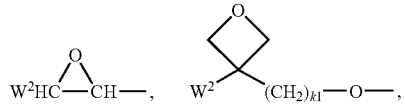

$CH_2=CW^2-(O)_{k1}-$, $CH_3-CH=CH-O-$, $(CH_2=CH)_2CH-OCO-$, $(CH_2=CH-CH_2)_2CH-OCO-$, $(CH_2=CH)_2CH-O-$, $(CH_2=CH-CH_2)_2N-$, $HO-CW^2W^3-$, $HS-CW^2W^3-$, $HW^2N-$, $HO-CW^2W^3-NH-$, $CH_2=CW^1-CO-NH-$, $CH_2=CH-(COO)_{k1}-Phe-(O)_{k2}-$, $Phe-CH=CH-$, $HOOC-$, $OCN-$, and $W^4W^5W^6Si-$, with $W^1$ being H, Cl, CN, phenyl or alkyl with 1 to 5 C-atoms, $W^2$ and $W^3$ being independently of each other H or alkyl with 1 to 5 C-atoms, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1.

14. A monomer, oligomer or polymer according to claim 1, wherein $-[(A)_a\text{-}(B)_b-(C)_c\text{-}(D)_d]-$ is selected from the following formulae

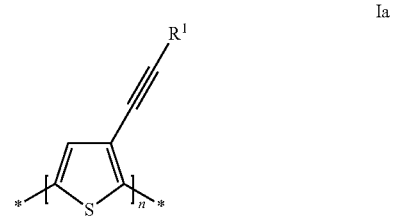

Ia

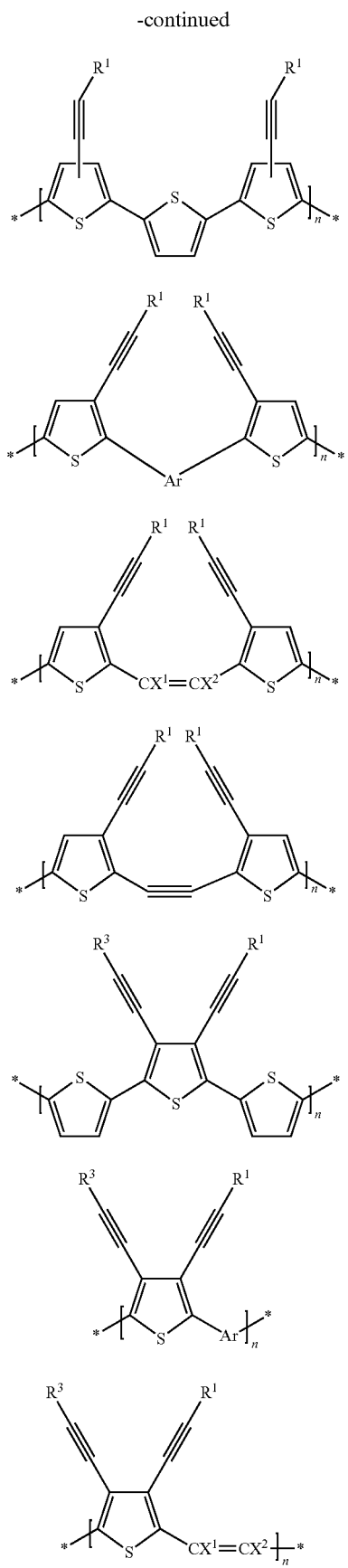

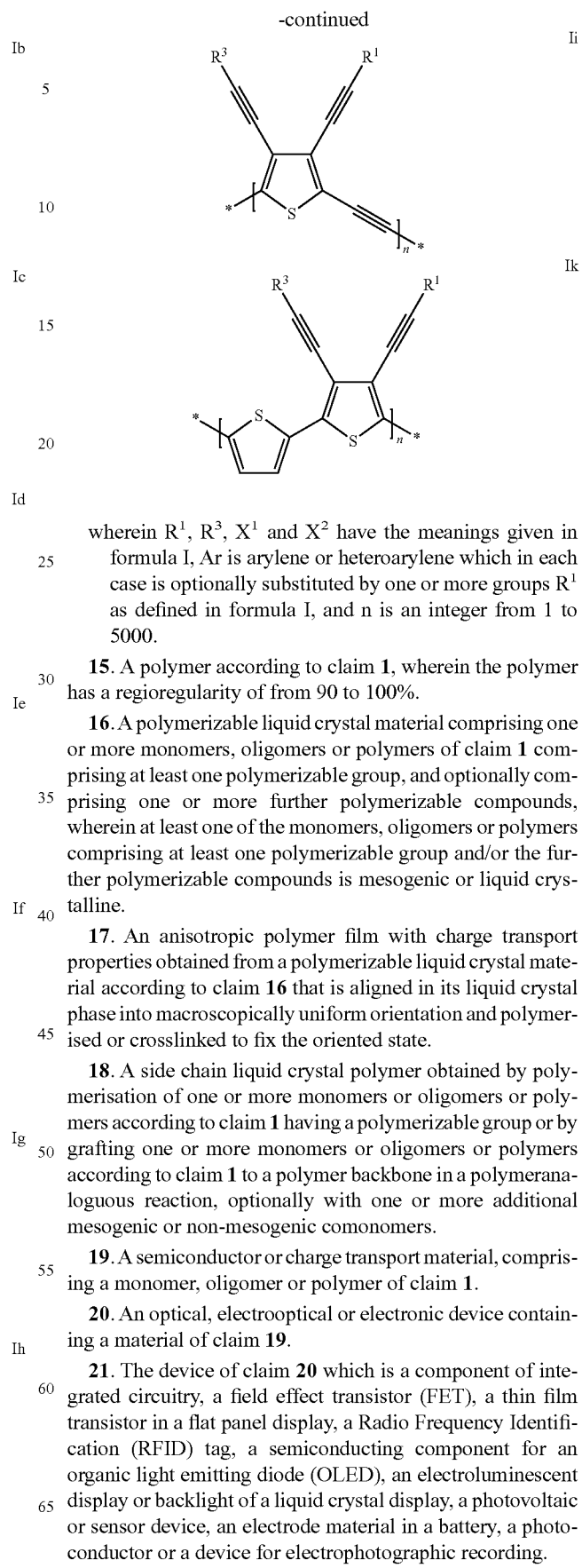

wherein $R^1$, $R^3$, $X^1$ and $X^2$ have the meanings given in formula I, Ar is arylene or heteroarylene which in each case is optionally substituted by one or more groups $R^1$ as defined in formula I, and n is an integer from 1 to 5000.

15. A polymer according to claim 1, wherein the polymer has a regioregularity of from 90 to 100%.

16. A polymerizable liquid crystal material comprising one or more monomers, oligomers or polymers of claim 1 comprising at least one polymerizable group, and optionally comprising one or more further polymerizable compounds, wherein at least one of the monomers, oligomers or polymers comprising at least one polymerizable group and/or the further polymerizable compounds is mesogenic or liquid crystalline.

17. An anisotropic polymer film with charge transport properties obtained from a polymerizable liquid crystal material according to claim 16 that is aligned in its liquid crystal phase into macroscopically uniform orientation and polymerised or crosslinked to fix the oriented state.

18. A side chain liquid crystal polymer obtained by polymerisation of one or more monomers or oligomers or polymers according to claim 1 having a polymerizable group or by grafting one or more monomers or oligomers or polymers according to claim 1 to a polymer backbone in a polymeranaloguous reaction, optionally with one or more additional mesogenic or non-mesogenic comonomers.

19. A semiconductor or charge transport material, comprising a monomer, oligomer or polymer of claim 1.

20. An optical, electrooptical or electronic device containing a material of claim 19.

21. The device of claim 20 which is a component of integrated circuitry, a field effect transistor (FET), a thin film transistor in a flat panel display, a Radio Frequency Identification (RFID) tag, a semiconducting component for an organic light emitting diode (OLED), an electroluminescent display or backlight of a liquid crystal display, a photovoltaic or sensor device, an electrode material in a battery, a photoconductor or a device for electrophotographic recording.

22. A field effect transistor comprising one or more monomers, oligomers or polymers according to claim 1.

23. A field effect transistor of claim 22, which is a component of integrated circuitry, a thin film transistor in a flat panel display, or a Radio Frequency Identification (RFID) tag.

24. A security marking or device comprising comprising one or more monomers, oligomers or polymers, of claim 1.

25. A security marking or device of claim 24, which comprises a field effect transistor or Radio Frequency Identification tag.

26. A monomer, oligomer or polymer according to claim 1, which is oxidatively or reductively doped to form a conducting ionic species.

27. A charge injection layer, planarizing layer, antistatic film or conducting substrate or pattern for electronic applications or flat panel displays, comprising a conducting ionic species according to claim 26.

* * * * *